United States Patent [19]

Dunn et al.

[11] Patent Number: 4,808,839
[45] Date of Patent: Feb. 28, 1989

[54] POWER FIELD EFFECT TRANSISTOR DRIVER CIRCUIT FOR PROTECTION FROM OVERVOLTAGES

[75] Inventors: William C. Dunn, Scottsdale; Philip W. McEntarfer, Chandler, both of Ariz.

[73] Assignee: Motorola, Inc., Schaumburg, Ill.

[21] Appl. No.: 177,209

[22] Filed: Apr. 4, 1988

[51] Int. Cl.⁴ .................. H03K 17/08; H03K 17/16; H03K 17/687; H03K 3/013
[52] U.S. Cl. .................. 307/296.4; 307/542.1; 307/544; 307/577; 307/246; 361/91; 361/111
[58] Field of Search .............. 307/571, 575, 577, 246, 307/542.1, 584, 544, 296.4; 361/91, 111, 56

[56] References Cited

U.S. PATENT DOCUMENTS

| | | | |
|---|---|---|---|
| 3,191,121 | 6/1965 | Nelson | 307/542 |
| 4,513,341 | 4/1985 | Kollanyi | 361/91 |
| 4,573,099 | 2/1986 | Ganesan et al. | 361/91 |
| 4,634,903 | 1/1987 | Montorfano | 307/571 |
| 4,649,302 | 3/1987 | Damiano et al. | 307/584 |
| 4,750,078 | 6/1988 | Ganger | 361/56 |

*Primary Examiner*—Stanley D. Miller
*Assistant Examiner*—Nancy Thai
*Attorney, Agent, or Firm*—William E. Koch

[57] ABSTRACT

A power field effect transistor driver circuit manufacturable in a MOS process is provided wherein a power field effect transistor provides high current drive capability for driving fractional horsepower DC motors or other inductive loads. The power field effect transistor driver circuit provides reliable operation under environmentally harsh conditions such as overvoltage transients at the supply voltage terminals, loss of ground supply terminal connection, and short circuits at the load terminal.

22 Claims, 2 Drawing Sheets

POWER FIELD EFFECT TRANSISTOR DRIVER CIRCUIT FOR PROTECTION FROM OVERVOLTAGES

FIELD OF THE INVENTION

This invention relates in general to driver circuits and more particularly, to a metal oxide semiconductor (MOS) power field effect driver circuit providing large current drive capacity while simultaneously providing protection to a power field effect transistor from negative or positive overvoltages and further preventing spurious operation due to power supply fluctuations or loss of the ground supply terminal connection due to, for example, faulty wiring or vibration.

BACKGROUND OF THE INVENTION

Power field effect transistor driver circuits are typically used to drive fractional horsepower DC motors and solenoids. Applications requiring the use of low voltage fractional horsepower DC motors and solenoids include electric fuel pumps, anti-skid braking systems, automatic transmission controllers, robotic mechanical controls, small industrial machines, etc. Heretofore, conventional bipolar devices have been used in circuits to drive such loads. The bipolar design is not very useful, however, due to the large base current requirements and high power dissipation of the bipolar transistors. Darlington transistors have been substituted for the conventional bipolar transistors to decrease the base current requirements and thus reducing the power requirements thereto. However, the performance provided by the Darlington transistors suffers from a large forward voltage drop across the devices, especially in low voltage, high current applications. The forward voltage drop reduces the voltage available to the DC motor resulting in a decreased motor speed. The use of Darlington transistors in a motor driver circuit is not very practical in automobile applications having a fixed voltage supply and requiring optimum motor speed. Further, both conventional bipolar devices and Darlington transistors are not readily interfaced to MOS microprocessors for controlling motor speed.

More recently, methods of driving fractional horsepower DC motors with power field effect transistors have been disclosed that overcome the high base drive requirement and forward voltage drop problem. For example, U.S. Pat. No. 4,454,454 discloses an "H" switch circuit employing power MOS field effect transistors which have low power dissipation, low voltage drops, and allows for easy MOS microprocessor interfacing for motor speed control. An "H" switch typically comprises four power field effect transistors capable of driving a fractional horsepower DC motor in forward and reverse directions A high side driver circuit having only one power field effect transistor is used in applications requiring torque in one direction only. The use of "H" switch and high side driver circuits for driving fractional horsepower DC motors in automobile and other critical applications requires proper operation even under environmentally difficult conditions. In the automobile application, for example, large positive voltage spikes may appear at the positive battery terminal due to a battery jump or faulty alternator operation, large negative voltages may appear at the DC motor being driven due to collapsing currents in the inductive windings of the DC motor, and loss of battery ground may be intermittent due to a poor ground supply terminal connection.

Thus, what is needed is a power field effect transistor driver circuit capable of driving fractional horsepower DC motors and other loads while providing protection to a power field effect transistor from negative or positive overvoltages and further preventing spurious operation due to power supply fluctuations or loss of the ground supply terminal connection due to, for example, faulty wiring or vibration.

SUMMARY OF THE INVENTION

Accordingly, an object of the present invention is to provide an improved power field effect transistor driver circuit.

A further object of the present invention is to provide an improved power field effect transistor driver circuit providing protection from supply overvoltage fluctuations at the supply voltage terminals.

Yet another object of the present invention is to provide an improved power field effect transistor driver circuit providing protection under large negative load voltage conditions.

Still a further object of the present invention is to provide an improved power field effect transistor driver circuit which prevents spurious operation due to loss of the ground supply terminal connection.

In carrying out the above and other objects of the invention in one form, there is provided a power field effect transistor coupled between a first supply voltage terminal and a load terminal, and having a gate coupled to a driver voltage terminal. A load, typically a DC motor or solenoid, is coupled between the load terminal and a chassis ground terminal. A driver circuit coupled between the driver voltage terminal and the load terminal comprises a first field effect transistor having a drain coupled to the gate of the power field effect transistor by a first resistor, a source coupled to the load terminal, and a gate coupled to a control input terminal. A second field effect transistor has a source coupled to a second supply voltage terminal, a gate coupled to the control input terminal, and a drain coupled to a first zener diode by a second resistor, the first zener diode being coupled to the gate of the power field effect transistor. A first diode is coupled in parallel with the second resistor, and a second diode is coupled between the source of the second field effect transistor and the load terminal. A second zener diode is coupled between the gate of the power field effect transistor and the load terminal.

The above and other objects, features, and advantages of the present invention will be better understood from the following detailed description taken in conjunction with the accompanying drawings.

DETAILED DESCRIPTION OF THE INVENTION

Figure 1:
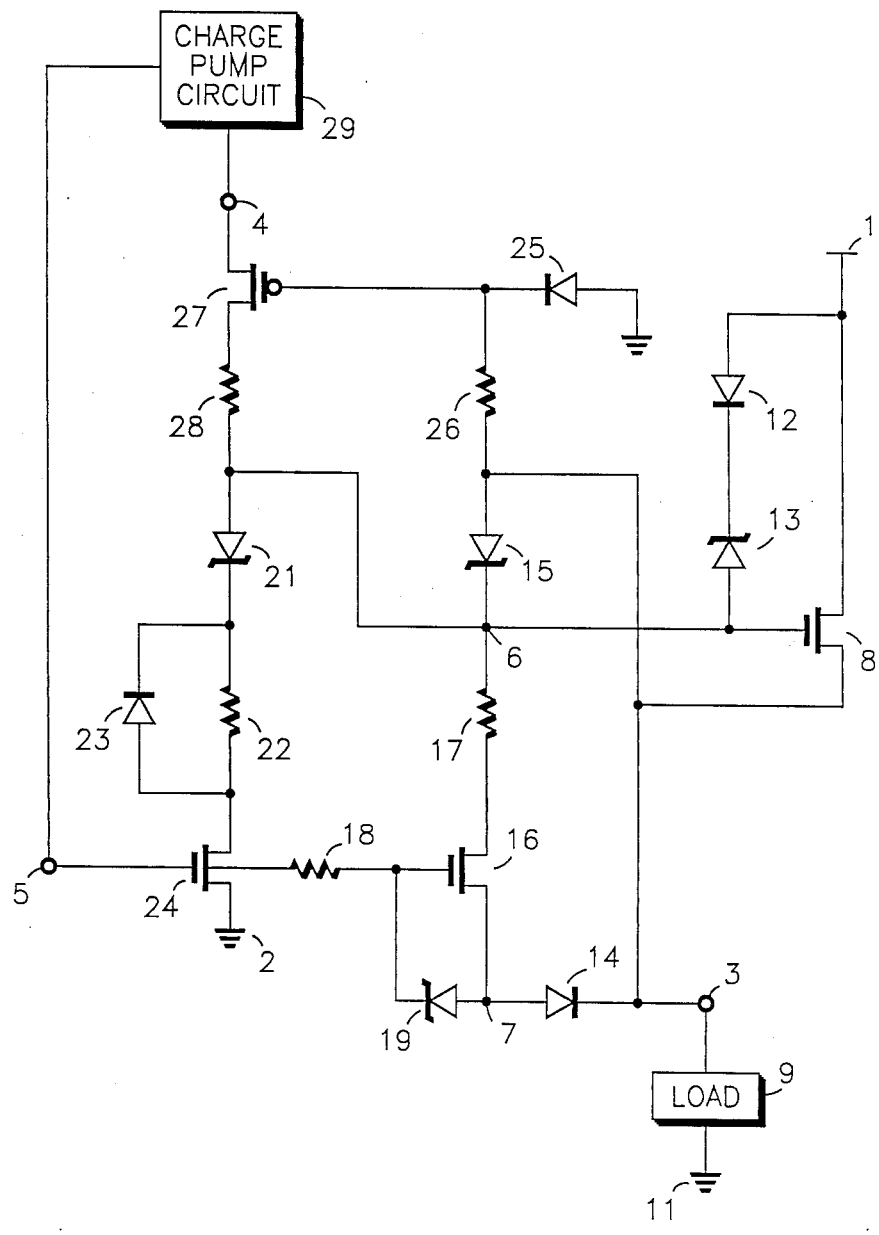
FIG. 1 is a schematic of a first embodiment of the present invention

Referring to FIG. 1, a power field effect transistor driver circuit configured as a high side driver circuit manufacturable in a MOS process comprises a power field effect transistor 8 having a drain connected to a supply voltage terminal 1, a source connected to a load terminal 3, and a gate connected to a driver node 6. The power field effect transistor 8 exhibits a very low channel resistance when in the conducting state (rdson), typically less than 1 ohm, therein dissipating little power ($P_d$) when sinking or sourcing a load current ($I_{load}$). The power dissipation of the power field effect transistor 8 is calculated by:

$$P_d = rdson \times (I_{load})^2.$$

Since rdson is small, only a negligible voltage develops across the source and the drain of the power field effect transistor 8. Several MOS power field effect transistors are suitable for this function, including lateral DMOS, vertical DMOS, and updrain DMOS devices. The load 9 driven by the high side driver circuit is typically a fractional horsepower DC motor coupled between the load terminal 3 and a chassis ground terminal 11.

A Diode 12 has an anode connected to the supply voltage terminal 1 and a cathode connected to a cathode of a zener diode 13. The zener diode 13 has an anode connected to the driver node 6. If a positive supply voltage on supply voltage terminal 1 exceeds the safe operating range (the magnitude of the positive supply voltage becomes large enough to cause gate oxide breakdown) of the high side driver circuit, the zener breakdown voltage of the zener diode 13 will be exceeded causing the zener diode 13 to avalanche, therein limiting the voltage across the gate and drain of the power field effect transistor 8. The Diode 12 ensures that a driver voltage at the driver node 6 is decoupled from the supply voltage terminal 1 when the driver voltage is positive, and the zener diode 13 further blocks the driver voltage from reaching the supply voltage terminal 1 when the driver voltage is negative.

A zener diode 15 has an anode connected to the load terminal 3 and a cathode connected to the driver node 6. If the magnitude of the driver voltage exceeds the zener breakdown voltage of the zener diode 15, avalanche occurs, therein preventing gate oxide breakdown of the power field effect transistor 8. Similarly, if the magnitude of the load voltage is negative and exceeds the zener breakdown voltage of the zener diode 15, avalanching will occur, therein further protecting the gate oxide of the power field effect transistor 8.

A diode 14 has a cathode connected to the load terminal 3 and an anode connected to a node 7. A field effect transistor 16 has a source connected to the node 7, a drain coupled to the driver node 6 by a resistor 17, and a gate coupled to a control input terminal 5 by a resistor 18. A zener diode 19 has an anode connected to the node 7 and a cathode connected to the gate of the field effect transistor 16. The zener diode 19 provides protection to the gate oxide of the field effect transistor 16 by limiting the voltage across the gate and source to a base-emitter voltage ($V_{be}$) in the negative direction, and to its zener breakdown voltage in the positive direction.

A field effect transistor 24 has a source connected to a supply voltage terminal 2, a gate connected to the control input terminal 5, and a drain coupled to both a cathode of a zener diode 21 and a cathode of a diode 23 by a resistor 22 and further connected to an anode of the diode 23. The zener diode 21 has an anode connected to the driver node 6. A Diode 25 has an anode connected to the supply voltage terminal 2, and a cathode coupled to the load terminal 3 by a resistor 26. A field effect transistor 27 has a source connected to a driver voltage terminal 4, a gate connected to the cathode of the diode 25, and a drain coupled to the driver node 6 by a resistor 28.

A charge pump circuit 29 is coupled between the driver voltage terminal 4 and the control input terminal 5. A charge pump is a circuit which uses voltage multiplication techniques to make available a charge pump voltage which is greater in magnitude than the voltage sourcing the charge pump. The charge pump circuit 29, then, makes available a charge pump voltage at the driver voltage terminal 4 wherein the magnitude of the charge pump voltage charges to a potential greater than the magnitude of the positive supply voltage, and the magnitude of the driver voltage is substantially equal to the magnitude of the charge pump voltage when the field effect transistor 27 in on. The use of the charge pump circuit 29 is desirable since the power field effect transistor 8 is an N-channel device. This allows the gate potential of the power field effect transistor 8 to rise to some potential above its source and drain potentials to reduce the rdson of its channel as well as minimizing the voltage developed across the source and drain terminals of the device. The charge pump circuit 29 is enabled (output is in a low impedance state and the charge pump voltage is positive) when the control voltage at the control input terminal 5 is low, and the charge pump circuit 29 is disabled (output is in a high impedance state and the charge pump voltage is zero) when the control voltage is high.

When the control voltage is low and the charge pump circuit 29 is enabled, the field effect transistor 27 is in its conducting state, causing the driver voltage to rise at a rate determined by the charge pump voltage and by the RC time constant of the resistor 28 and the gate capacitance associated with the power field effect transistor 8. The field effect transistor 27 is held in its conducting state while the charge pump 29 is enabled since its source potential is the charge pump voltage which rises above its gate potential. The field effect transistors 16 and 24 are in their non-conducting state isolating the driver voltage and charge pump circuit 29 from the supply voltage terminal 2 and the load terminal 3. As the driver voltage rises above an N-channel threshold voltage, the power field effect transistor 8 conducts to source the load current to the load 9. Because the voltage drop across the source and the drain of the power field effect transistor 8 is negligible, the load voltage at the load terminal 3 is approximately equal to the positive supply voltage.

In order to keep the power field effect transistor 8 conducting once its source is approximately equal to the positive supply voltage, the driver voltage at the gate must be pulled at least a threshold voltage above the source. This is the purpose for using the charge pump circuit 29. It is possible to manufacture the power field effect transistor driver circuit using a P-channel field effect transistor in place of the power field effect transistor 8. Using a P-channel field effect transistor would negate the need for the charge pump circuit 29. As the source of a P-channel device goes to a more positive potential, the device will stay turned on as long as the voltage at the gate potential is at least one threshold voltage below the source potential. However, the N-channel power field effect transistor 8 generally offers better performance than does a P-channel power field effect transistor for a given area of silicon.

The high side driver circuit reaches a steady state when the driver voltage reaches its peak value, and a constant load current is available to the load 9. If the load terminal 3 were unintentionally shorted to the chassis ground terminal 11 or to $V_{SS}$ at the supply voltage terminal 2, the full potential of the driver voltage would appear across the gate and source of the power field effect transistor 8. The zener diode 15 limits the voltage across the gate and the source of the power field effect transistor 8 to its zener breakdown voltage to protect the gate oxide from high voltage breakdown.

When the control voltage goes high, the charge pump circuit 29 is disabled and the field effect transistor 27 turns off since its source will be at a zero voltage potential. The field effect transistor 24 turns on causing the driver voltage to discharge to the supply voltage terminal 2 at a rate limited by the RC time constant of the resistor 22 and the gate capacitance of the power field effect transistor 8. As the driver voltage discharges towards $V_{SS}$, the power field effect transistor 8 discontinues sourcing the load current to the load 9.

If the load 9 were a fractional horsepower DC motor or some other inductive load, a negative load voltage will appear when the load current stops flowing. This is an effect of the collapsing fields in the inductor known as kickback The power field effect transistor 8 is prevented from turning back on since the field effect transistor 16 turns on when the load voltage reaches an N-channel threshold voltage below the control voltage and therein effectively shorting the gate of the power field effect transistor 8 to its source. The diode 25 limits the voltage at the gate of the field effect transistor 27 to going no more negative than a $V_{be}$, keeping it turned off and maintaining the isolation of the charge pump circuit 29 from the supply voltage terminal 2 and the load terminal 3. The load voltage being more negative than the zener breakdown of the zener diode 21, discharges through the field effect transistor 16, the resistor 17, the zener diode 21, and the diode 23 to the supply voltage terminal 2. Should the load voltage go more negative than the sum of a $V_{be}$ and an N-channel threshold voltage below the zener breakdown voltage of the zener diode 21, the power field effect transistor 8 turns back on quickly discharging the load voltage to the supply voltage terminal 1. When the load voltage is discharged, the power field effect transistor 8 turns off and the high side driver circuit is in a off steady state.

Positive and negative voltage spikes may appear at the load terminal due to energy stored in the inductive windings of a fractional horsepower DC motor or due to system noise. While in the off steady state condition, a positive voltage spike would be limited to one $V_{be}$ at the gate of the power field effect transistor 8 due to the action of the zener diode 15. A negative voltage spike, at least a threshold voltage below the control voltage, appearing at the load terminal 3 causes the field effect transistor 16 to turn on thus ensuring the power field effect transistor 8 does not inadvertently conduct current to the load terminal 3. Also if the supply voltage terminal 2 connection is broken, the control voltage will float towards the supply voltage 1 therein keeping the power field effect transistor 8 turned off since the field effect transistor will conduct to keep the gate of the power field effect transistor 8 shorted to its source.

Figure 2:
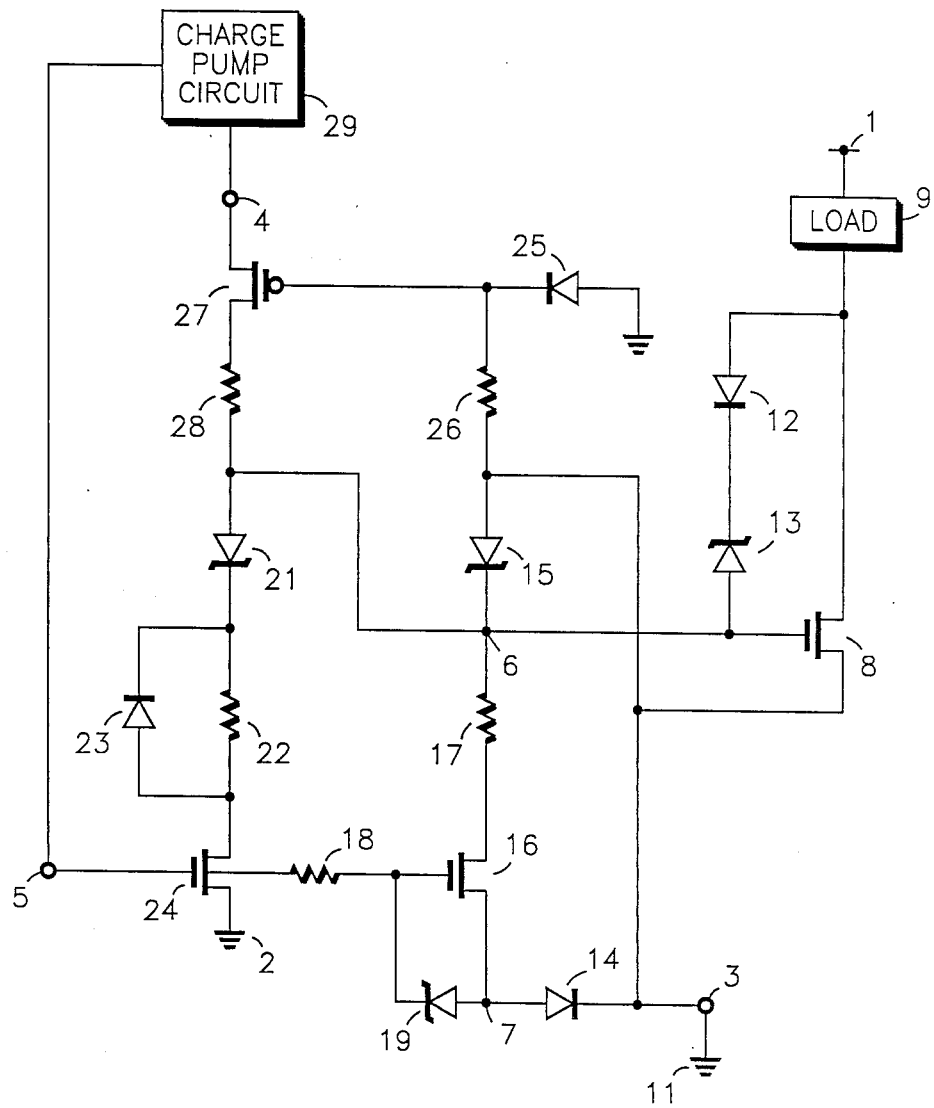
FIG. 2 is a schematic of a second embodiment of the present invention.

The power field effect transistor driver circuit is shown in FIG. 2 configured as a low side driver circuit. In order to implement the low side driver circuit only two changes are required from that of the high side driver circuit. These changes include connecting the load terminal 3 to the chassis ground terminal 11, and coupling the load 9 between the supply voltage terminal 1 and the drain of the power field effect transistor 8 and the anode of the diode 12. A load current is made available to the load 9 when the control voltage is low, and the load current is cutoff when the control voltage is high as before. The use of the charge pump circuit 29 in this configuration is not mandatory since the source of the power field effect transistor 8 is connected to the chassis ground terminal 11. The charge pump circuit, however, does provide the circuit with improved performance by driving the gate of the power field effect transistor 8 to a higher potential than would otherwise be possible.

The power field effect transistor driver circuit is not limited to applications requiring fractional horsepower DC motors to rotate in one direction. For example, four such circuits can be used together to build the drivers of an "H" switch, therein providing the extra protection benefits to the "H" switch. Further, the power field effect transistor driver circuit is able to provide drive for other loads requiring high current drive and low power dissipation that may be resistive, capacitive, inductive, or some combination thereof. Further, the power field effect transistor driver circuit is readily interfaced to MOS microprocessor circuits for controlling the load current since the control voltage works with digital logic levels.

By now it should be appreciated that there has been provided a power field effect transistor driver circuit providing large current drive capacity while simultaneously providing protection to a power field effect transistor from negative or positive overvoltages and further preventing spurious operation due to supply fluctuations or loss of the ground supply terminal connection due to, for example, faulty wiring or vibration.

We claim:

1. A circuit comprising:
   a load terminal;
   a first supply voltage terminal;
   a second supply voltage terminal;
   a driver voltage terminal for receiving a driver voltage;
   first means coupled between said first supply voltage terminal and said load terminal and to said driver voltage terminal for providing a current to said load terminal in response to said driver voltage wherein the magnitude of the current depends on the magnitude of the driver voltage; and
   second means coupled between said second supply voltage terminal and said driver voltage terminal and to said load terminal for preventing said first means from providing the current when the magnitude of the voltage on said load terminal is less than the magnitude of the voltage on said second supply voltage terminal, or when said second supply voltage terminal is inadvertently uncoupled from said second means.

2. A circuit according to claim 1 wherein said first means comprises a power field effect transistor having a drain coupled to said first supply voltage terminal, a source coupled to said load terminal, and a gate coupled to said driver voltage terminal.

3. A circuit according to claim 1 wherein said second means further controls the magnitude and rate of change of the driver voltage.

4. A circuit according to claim 1 wherein said second means further prevents said first means from breakdown due to voltages at said first and second supply voltage terminals exceeding a predetermined magnitude.

5. A circuit according to claim 1 further comprising a charge pump means for selectively providing a charge pump voltage at said driver voltage terminal, wherein the magnitude of the charge pump voltage is greater than the magnitude of the positive supply voltage.

6. A circuit according to claim 1 for driving a load, wherein said load is coupled between said load terminal and a third supply voltage terminal.

7. A circuit according to claim 1 for driving a load, wherein said load is coupled between said first means and said first supply voltage terminal.

8. A circuit according to claim 1 wherein said second means comprises:
  a first resistor;
  a second resistor;
  a control input terminal for receiving a control voltage;
  a first field effect transistor having a source coupled to said load terminal, a gate coupled to said control input terminal, and a drain coupled to said driver voltage terminal by said first resistor;
  a second field effect transistor having a source coupled to said second supply voltage terminal, a gate coupled to said control input terminal, and having a drain;
  third means coupled to the drain of said second field effect transistor by said second resistor and coupled to said driver voltage terminal for providing a drain voltage to the drain of said second field effect transistor when the magnitude of the drain voltage is greater than the magnitude of the second supply voltage, and for blocking the drain voltage from the drain of said second field effect transistor until the drain voltage reaches a predetermined magnitude less than the magnitude of the voltage on said second supply voltage terminal; and
  fourth means coupled between the third means and the drain of said second field effect transistor for limiting the portion of the load voltage that develops across said second resistor when the magnitude of the load voltage is less than the magnitude of the voltage on said second supply voltage terminal.

9. A circuit according to claim 8 wherein said third means comprises a zener diode having an anode coupled to the gate of said power field effect transistor and a cathode coupled to the drain of said second field effect transistor by said second resistor.

10. A circuit according to claim 9 wherein said fourth means comprises a diode having a cathode coupled to the cathode of said zener diode and an anode coupled to the drain of said second field effect transistor.

11. A circuit according to claim 9 further comprising a third resistor coupled between said driver voltage terminal, and both the gate of said power field effect transistor and the anode of said zener diode.

12. A circuit comprising:
  a load terminal;
  a first supply voltage terminal;
  a second supply voltage terminal;
  a driver voltage terminal for receiving a driver voltage;
  a control input terminal for receiving a control voltage;
  a first resistor;
  a second resistor;
  first means coupled between said first supply voltage terminal and said load terminal and to said driver voltage terminal for providing a current to said load terminal wherein the magnitude of the current depends on the magnitude of the driver voltage;
  a first field effect transistor having a source coupled to said load terminal, a gate coupled to said control input terminal, and a drain coupled to said driver voltage terminal by said first resistor;
  a second field effect transistor having a source coupled to said second supply voltage terminal, a gate coupled to said control input terminal, and having a drain;
  second means coupled to the drain of said second field effect transistor by said second resistor and coupled to said driver voltage terminal for providing a drain voltage on the drain of said second field effect transistor when the magnitude of the drain voltage is greater than the magnitude of the second supply voltage, and for blocking the drain voltage from the drain of said second field effect transistor until the drain voltage reaches a predetermined magnitude less than the second supply voltage; and
  third means coupled between the second means and the drain of said second field effect transistor for limiting the portion of the load voltage that develops across said second resistor when the magnitude of the load voltage is less than the magnitude of the voltage on said second supply voltage terminal.

13. A circuit according to claim 12 wherein said first means comprises a power field effect transistor having a drain coupled to said first supply voltage terminal, a source coupled to said load terminal, and a gate coupled to said driver voltage terminal.

14. A circuit according to claim 13 further comprising a third resistor coupled between the gate of said power field effect transistor and said driver voltage terminal.

15. A circuit according to claim 13 wherein said second means comprises a first zener diode having an anode coupled to the gate of said power field effect transistor and a cathode coupled to the drain of said second field effect transistor by said second resistor.

16. A circuit according to claim 15 wherein said third means comprises a first diode having a cathode coupled to the cathode of said first zener diode and an anode coupled to the drain of said second field effect transistor.

17. A circuit according to claim 15 further comprising a second diode having an anode coupled to the source of said first field effect transistor and a cathode coupled to said load terminal.

18. A circuit according to claim 15 further comprising a second zener diode having a cathode coupled to the gate of said power field effect transistor and an anode coupled to said load terminal.

19. A circuit according to claim 15 wherein said circuit further comprises:
  a third diode having an anode coupled to said first supply voltage terminal, and having a cathode;
  a third zener diode having an anode coupled to the gate of said power field effect transistor and a cathode coupled to the cathode of said third diode.

20. A circuit according to claim 18 further comprising:
  a fourth resistor;
  a third field effect transistor having a source coupled to the driver voltage terminal, a drain coupled to the gate of said power field effect transistor by said third resistor, and a gate coupled to said load terminal by said fourth resistor.

21. A circuit according to claim 20 further comprising a fourth diode having an anode coupled to said second supply voltage terminal and a cathode coupled to the gate of said third field effect transistor.

22. A circuit comprising:
a load terminal;
a first supply voltage terminal;
a second supply voltage terminal;
a driver voltage terminal for receiving a driver voltage;
a control input terminal for receiving a control voltage;
a first resistor;
a second resistor;
a third resistor;
a fourth resistor;
a power field effect transistor having a drain coupled to said first supply voltage terminal, a source coupled to said load terminal, and a gate coupled to said driver voltage terminal;
a first field effect transistor having a source coupled to said load terminal, a gate coupled to said control input terminal, and a drain coupled to the gate of said power field effect transistor by said first resistor;
a second field effect transistor having a source coupled to said second supply voltage terminal, a gate coupled to said control input terminal, and having a drain;
a first zener diode having an anode coupled to the gate of said power field effect transistor and a cathode coupled to the drain of said second field effect transistor by said second resistor;
a first diode having a cathode coupled to the cathode of said first zener diode and an anode coupled to the drain of said second field effect transistor;
a second diode having an anode coupled to the source of said first field effect transistor and a cathode coupled to said load terminal;
a second zener diode having a cathode coupled to the gate of said power field effect transistor and an anode coupled to said load terminal;
a third diode having an anode coupled to said first supply voltage terminal, and having a cathode;
a third zener diode having an anode coupled to the gate of said power field effect transistor and a cathode coupled to the cathode of said third diode;
a third field effect transistor having a source coupled to said driver voltage terminal, a drain coupled to the gate of said power field effect transistor by said third resistor, and a gate coupled to said load terminal by said fourth resistor; and
a fourth diode having an anode coupled to said second supply voltage terminal and a cathode coupled to the gate of said third field effect transistor.

* * * * *